US012765068B2

(12) United States Patent
Lee et al.

(10) Patent No.: US 12,765,068 B2
(45) Date of Patent: Oct. 13, 2026

(54) SYNAPTIC ARRAY STRUCTURE BASED ON CMOS INTEGRATION TECHNOLOGY AND METHOD OF FABRICATING THE SYNAPTIC ARRAY STRUCTURE

(71) Applicant: Seoul National University R&DB FOUNDATION, Seoul (KR)

(72) Inventors: Jong-Ho Lee, Seoul (KR); Min Kyu Park, Seoul (KR); Joon Hwang, Seoul (KR); Ryunhan Gu, Seoul (KR); Won Mook Kang, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 423 days.

(21) Appl. No.: 18/488,916

(22) Filed: Oct. 17, 2023

(65) Prior Publication Data

US 2024/0136359 A1 Apr. 25, 2024
US 2024/0234426 A9 Jul. 11, 2024

(30) Foreign Application Priority Data

Oct. 24, 2022 (KR) ........................ 10-2022-0137808

(51) Int. Cl.
*H10D 87/00* (2026.01)
*H10D 84/01* (2026.01)
*H10D 84/03* (2025.01)

(52) U.S. Cl.
CPC ........... *H10D 87/00* (2025.01); *H10D 84/017* (2025.01); *H10D 84/038* (2025.01)

(58) Field of Classification Search
CPC ..... H10D 84/017; H10D 84/038; H10D 87/00
See application file for complete search history.

(56) References Cited

U.S. PATENT DOCUMENTS 9,147,615 B2 * 9/2015 Afzali-Ardakani .... G06N 3/063
2016/0133317 A1 * 5/2016 Lee .................... H10D 30/6757 257/314

(Continued)

FOREIGN PATENT DOCUMENTS

KR 20150089299 A 8/2015
KR 20160056816 A 5/2016

(Continued)

*Primary Examiner* — Shaun M Campbell
(74) *Attorney, Agent, or Firm* — CANTOR COLBURN LLP

(57) ABSTRACT

Provided is a synaptic array structure. The synaptic array structure includes: an isolation insulating layer positioned in a predetermined area on a semiconductor substrate to isolate devices; TFT-type synaptic devices arranged in an array on an isolation insulating layer; and CMOS peripheral circuits provided on the semiconductor substrate. The TFT-type synaptic device includes: a source and a drain positioned on the isolation insulating layer; a semiconductor body positioned between the source and the drain; oxide layers positioned between the semiconductor body and the source/drain; a semiconductor layer for channel; a TFT gate insulating layer; and a TFT gate electrode. The present invention, based on CMOS integration technology, processes TFT-type synaptic devices and CMOS peripheral circuits together, thereby reducing the number of masks and fabrication steps used during the fabricating process.

10 Claims, 12 Drawing Sheets

(56) References Cited

U.S. PATENT DOCUMENTS

| | | | | |
|---|---|---|---|---|
| 2021/0098611 | A1* | 4/2021 | Hersam | G11C 13/0007 |
| 2022/0077314 | A1* | 3/2022 | Kim | H10D 30/711 |
| 2023/0210027 | A1* | 6/2023 | Bishop | H10N 70/245<br>257/4 |
| 2023/0419089 | A1* | 12/2023 | Choi | H10D 30/62 |

FOREIGN PATENT DOCUMENTS

| | | | |
|---|---|---|---|
| KR | 20210087389 | A | 7/2021 |
| KR | 20210104387 | A | 8/2021 |

* cited by examiner

<AND-type Array Architecture>

<NOR-type Array Architecture>

SYNAPTIC ARRAY STRUCTURE BASED ON CMOS INTEGRATION TECHNOLOGY AND METHOD OF FABRICATING THE SYNAPTIC ARRAY STRUCTURE

TECHNICAL FIELD

The present invention relates to a synaptic array structure based on CMOS integration technology and a method of fabricating the synaptic array structure. More specifically, the synaptic array structure based on CMOS integration technology according to the present invention is configured to cointegrate the TFT-type synaptic devices and the CMOS peripheral circuits on a semiconductor substrate using a novel fabrication method, thereby reducing the number of masks used during the fabrication processes and the number of steps of the fabrication process.

BACKGROUND ART

FIG. 1 is a cross-sectional view showing a TFT device according to the prior art. Referring to FIG. 1, the conventional TFT (Thin Film Transistor) device has a semiconductor substrate, an insulator formed on the substrate, a source SL and drain DL formed on the insulator, a semiconductor layer for channel formed to connect electrically the source and the drain by forming a channel, and a gate insulating layer and gate electrode formed thereon.

In general, memory devices store specific values by adding or subtracting electrons or holes into/from the gate insulating layer. For perform the operation, the memory device is programmed by applying a positive bias voltage to the gate electrode to insert electrons into the gate insulating layer or remove holes from the gate insulating layer, or the memory device is erased by applying a negative bias voltage to the gate electrode to remove electrons from the gate insulating layer or insert holes into the gate insulating layer.

In this way, applying the bias voltages to the gate electrode is performed by the CMOS peripheral circuits positioned near the memory devices.

Accordingly, the conventional TFT devices implement the positive bias voltage used in the program operation or the negative bias voltage used in the erase operation using CMOS peripheral circuits including an NMOSFET device and a PMOSFET device. However, in order to implement both the negative and positive bias voltages, there is a problem in that the CMOS peripheral circuits become larger in size and the design becomes more complicated.

During an erase operation in the memory device, electrons are removed from the gate insulating layer or holes are inserted into the gate insulating layer of the TFT device. However, in reality, since the holes rarely exist in the semiconductor layer where the channel is to be formed, the erase operation is mostly limited to pushing and removing electrons from the gate insulating layer. As a result, the TFT device requires a large erase voltage $V_{ERS}$ which is the voltage required during erase operation. Therefore, the TFT devices consume a lot of power when driving.

Meanwhile, in TFT devices, when a large voltage is applied to the drain, the electron-hole pairs (EHPs) are sometimes generated by an electric field. The generated electrons are directly sucked into the drain. However, although the generated holes may disappear naturally over a long period of time, there are cases where the generated holes are unable to go down due to the insulating layer existing under the semiconductor layer for channel and are accumulated under the semiconductor layer for channel.

Due to this situation, if the holes continue to accumulate under the channel, they themselves form a positive voltage, resulting in problems with the electrical characteristics of the device. This is called the Kink effect. The Kink effect is a common problem with conventional TFT devices.

Although various methods have been proposed to solve these problems, most solutions increase the number of masks used during the fabrication process and the number of steps of the fabrication process. As a result, the fabrication process becomes more complex and the cost for the fabrication increases.

SUMMARY OF THE INVENTION

In order to solve the above problems, an object of the present invention is to provide a synaptic array structure and a method of fabricating the synaptic array structure based on CMOS integration technology which cointegrate the TFT-type synaptic array and the CMOS peripheral circuits on a semiconductor substrate for a hardware-based neural network, thereby reducing the number of masks and fabrication steps required during the fabrication process.

According to a first aspect of the present invention, there is provides a synaptic array structure includes: a semiconductor substrate; an isolation insulating layer positioned in a predetermined area on the semiconductor substrate to isolate devices; a plurality of TFT-type synaptic devices arranged in an array on the isolation insulating layer; and a CMOS peripheral circuit including PMOSFET and NMOSFET devices provided on the semiconductor substrate. Additionally, the TFT-type synaptic device of the synaptic array structure includes: a source and drain positioned on the isolation insulating layer and spaced apart from each other by a predetermined distance, and made of a semiconductor material doped with a first type of impurities; a semiconductor body positioned between the source and the drain and made of a semiconductor material doped with a second type of impurities opposite to the first type; oxide layers positioned between the semiconductor body and the source and between the semiconductor body and the drain; a semiconductor layer for channel positioned on the upper surfaces of the semiconductor body and oxide layers, configured to electrically connect the source and the drain by forming a channel, and made of a semiconductor material; a TFT gate insulating layer positioned on the upper surface of the semiconductor layer for channel and comprising of at least one insulating layer; and a TFT gate electrode positioned on the upper surface of the TFT gate insulating layer and made of a conductive material.

In the synaptic array structure according to the first aspect of the present invention described above, it is preferable that the thickness of the gate electrodes of the PMOSFET and NMOSFET devices of the CMOS peripheral circuit is thicker than the thickness of the source and drain of the TFT-type synaptic device.

In the synaptic array structure according to the first aspect of the present invention described above, it is preferable that the TFT gate electrode of the TFT-type synaptic device is provided in a self-aligned form with the source and drain of the TFT-type synaptic device.

In the synaptic array structure according to the first aspect of the present invention described above, it is preferable that the synaptic array structure implements an AND-type synaptic array architecture by arranging the source and drain lines of TFT-type synaptic devices in parallel, or a NOR-type synaptic array architecture by arranging orthogonally the source and drain lines of the TFT-type synaptic devices.

In the synaptic array structure according to the first aspect of the present invention described above, it is preferable that the synaptic array structure implements a NAND-type synaptic array architecture by connecting TFT-type synaptic devices in series to form cell strings, and by connecting word lines to the TFT gate electrodes of TET-type synaptic devices, and further includes at least one switch device at each end of the cell strings.

In the synaptic array structure according to the first aspect of the present invention described above, it is preferable that the TFT gate insulating layer has a stack structure including at least a charge storage layer and an insulating layer.

In the synaptic array structure according to the first aspect of the present invention described above, it is preferable that the semiconductor body is configured to have different heights from the source and drain to have steps in the edges of the oxide layers connecting between the semiconductor body and the source and between the semiconductor body and the drain, and the semiconductor layer for channel on surface of the oxide layer is curved by the steps formed in the edges of the oxide layers, so that a short channel effect is suppressed by changing the effective length of the semiconductor layer for channel due to forming a curved channel.

In the synaptic array structure according to the first aspect of the present invention described above, it is more preferable that the upper surface of the semiconductor body of the TFT-type synaptic devices is formed higher than the upper surfaces of the source and drain of the TFT-type synaptic devices.

In the synaptic array structure according to the first aspect of the present invention described above, it is preferable that the semiconductor body is made of a semiconductor material doped with P-type impurities and is configured to provide holes to the semiconductor layer for channel during an erase operation, thereby reducing a erase voltage $V_{ERS}$ required during the erase operation for selected cells or being capable of performing the erase operation with only positive (+) bias voltage, and suppressing the erase operation for unselected cells.

In the synaptic array structure according to the first aspect of the present invention described above, it is preferable that the source or drain of the TFT-type synaptic device and the TFT gate electrode of the TFT-type synaptic device are provided to overlap each other, and the TFT gate insulating layer provided between the overlapping source and the TFT gate electrode or between the overlapping drain and the TFT gate electrode is used as a capacitor. According to a second aspect of the present invention, there is provides a method of fabricating a synaptic array structure having TFT-type synaptic devices and CMOS peripheral circuits is comprising the following steps: (a) forming a well for fabricating devices of the CMOS peripheral circuit in a first predetermined area in the semiconductor substrate and forming an isolation insulating layer for isolating the devices in a second predetermined area in the semiconductor substrate; (b) forming a semiconductor body doped with a first type of impurities on the isolation insulating layer and forming an oxide layer on the surface of the semiconductor body; (c) depositing a semiconductor material doped with a second type of impurities on the entire surface and then planarizing the upper surface of the deposited semiconductor material to expose the upper surface of the semiconductor body of the TFT-type synaptic device; (d) forming the source and drain of the TFT-type synaptic device, and forming the gate electrodes of an NMOSFET and a PMOSFET devices of the CMOS peripheral circuit; (e) forming the source and drain of the NMOSFET and PMOSFET devices of the CMOS peripheral circuit; (f) sequentially forming a semiconductor layer for channel and a TFT gate insulating layer on the upper surface of the TFT-type synaptic device; and (g) forming a TFT gate electrode and an electrode of a capacitor of the TFT-type synaptic device, wherein the TFT-type synaptic device and the NMOSFET and PMOSFET devices of the CMOS peripheral circuit share the fabrication process steps.

In the method of fabricating the synaptic array structure according to the second aspect of the present invention described above, it is preferable that the step (d) includes the following steps: (d1) forming the source and drain of the TFT-type synaptic device and simultaneously forming the gate electrodes of the NMOSFET and PMOSFET devices of the CMOS peripheral circuit using a photolithography process; and (d2) partially etching the source and drain of the TFT-type synaptic device without using additional masks, wherein the semiconductor body of the TFT-type synaptic device is formed to be higher than the source and drain of the TFT-type synaptic device.

In the method of fabricating the synaptic array structure according to the second aspect of the present invention described above, it is preferable that, in the process of step (d1), a material for fabricating the gate electrodes of the NMOSFET and PMOSFET devices of the CMOS peripheral circuit are deposited in the form of a thin film, and are deposited on the gate insulating layers of the NMOSFET and PMOSFET devices of the CMOS peripheral circuit and on the isolation insulating layer formed higher than the upper surface of the gate insulating layers of the NMOSFET and PMOSFET devices of the CMOS peripheral circuit, and the source and drain electrodes of the TFT-type synaptic device and the gate electrodes of the NMOSFET and PMOSFET devices of the CMOS peripheral circuit are planarized and patterned using a chemical-mechanical polishing process so that the thickness of the source and drain electrodes of the TFT-type synaptic device is configured to be thinner than that of the gate electrodes of the NMOSFET and PMOSFET devices of the CMOS peripheral circuit.

The synaptic array structure according to the present invention having the above-described configuration is configured to cointegrate the TFT-type synaptic devices and the CMOS peripheral circuits on a semiconductor substrate for a hardware-based neural network. As a result, the synaptic array structure according to the present invention can reduce the number of masks and fabrication steps required during the fabrication process.

In addition, the TFT-type synaptic device of the synaptic array structure according to the present invention having the above-described configuration further includes a semiconductor body 230 between the source and the drain. The semiconductor body 230 is not present in the conventional TFT device. Because of further including the semiconductor body 230 between the source and the drain, the TFT-type synaptic devices according to the present invention can (1) reduce the burden on peripheral circuits, (2) be required a relatively low erase voltage $V_{ERS}$ by providing holes during erase operation, and (3) solve the kink effect of conventional TFT devices.

In addition, the TFT-type synaptic device according to the present invention is configured that the semiconductor layer for channel to be bent. Because of this, the TFT-type synaptic device according to the present invention can (1) increase output resistance $r_o$ by reducing the short channel effect, and (2) improve the efficiency of the program and erase operations to increase the memory window or to reduce the program voltage $V_{PRM}$ and the erase voltage $V_{ERS}$. Additionally, the operating current of the TFT-type synaptic device according to the present invention is lowered, allowing it to operate at low power.

DETAILED DESCRIPTION

Hereinafter, the synaptic array structure based on the TFT-type synaptic device and the method of fabricating the synaptic array structure according to the present invention will be described in detail with reference to the accompanying drawings.

The synaptic array structure according to a preferred embodiment of the first aspect of the present invention includes a plurality of TFT-type synaptic devices arranged in an array on a semiconductor substrate, and CMOS peripheral circuits including a NMOSFET and PMOSFET devices on a semiconductor substrate.

The plurality of TFT-type synaptic devices are arranged in an array on an isolation insulating layer for isolating devices provided on the semiconductor substrate. The CMOS peripheral circuits are positioned on the semiconductor substrate and include PMOSFET devices and NMOSFET devices. The TFT-type synaptic devices and CMOS peripheral circuits of the synaptic array structure according to the present invention can be fabricated through the same fabricating processes. Hereinafter, the components of the synaptic array structure will be described in more detail with reference to the accompanying drawings.

Figure 1:
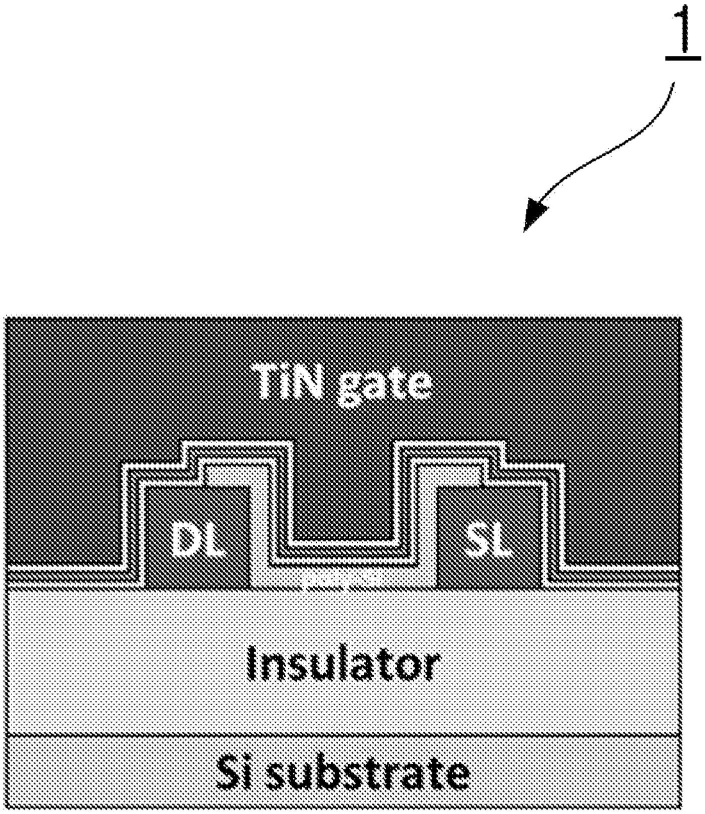
FIG. 1 Prior Art
FIG. 1 is a cross-sectional view showing a TFT device according to the prior art.
Figure 2A:
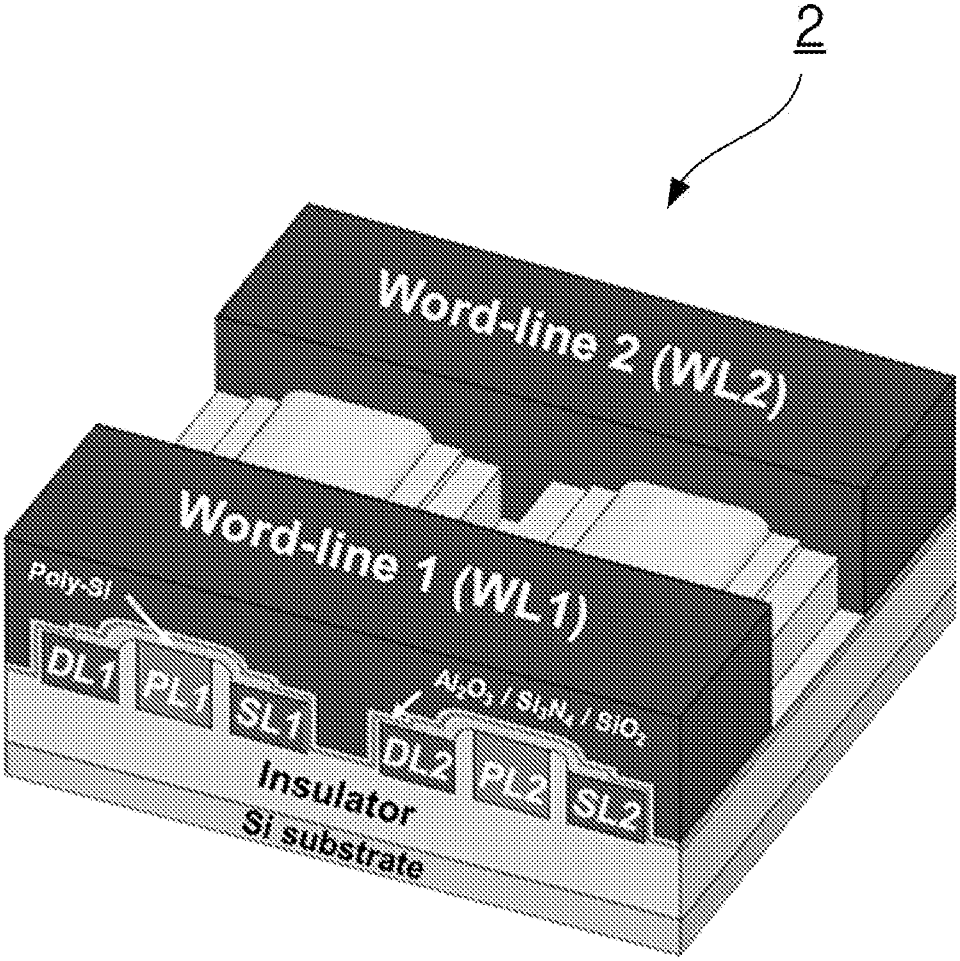
FIG. 2A and FIG. 2B are a schematic diagram and a cross-sectional view showing TFT-type synaptic devices of the synaptic array structure according to a preferred embodiment of the first aspect of the present invention, respectively.
Figure 2B:
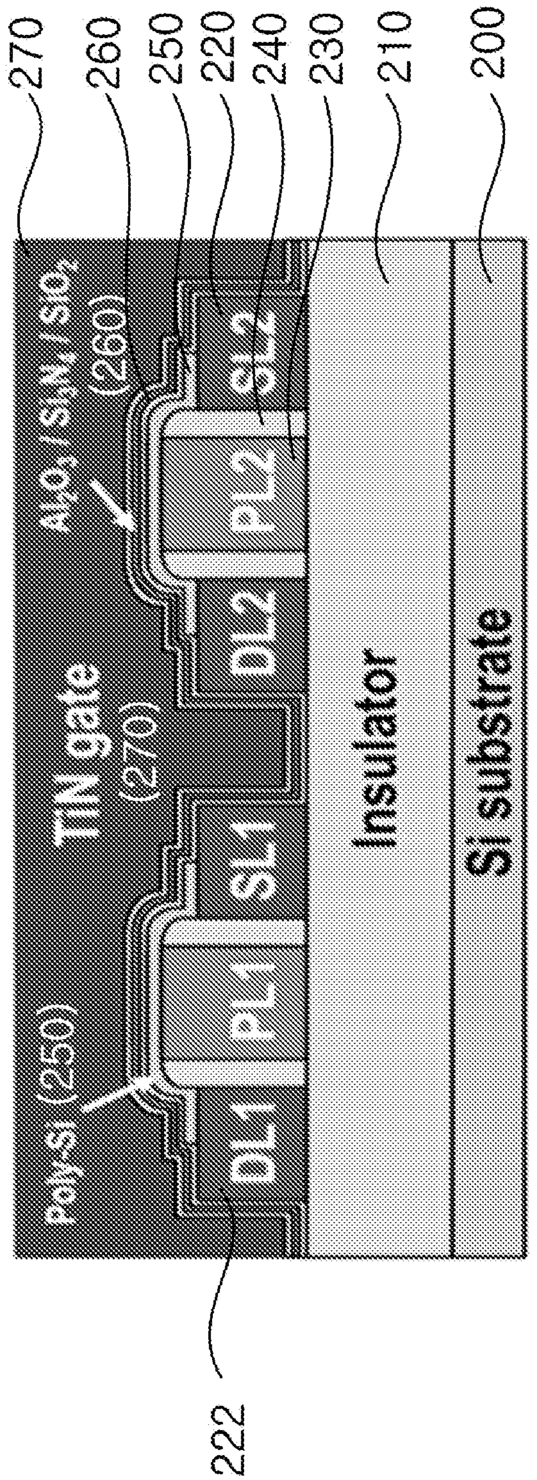

FIG. 2A and FIG. 2B are a schematic diagram and a cross-sectional view showing TFT-type synaptic devices in the synaptic array structure according to the preferred embodiment of the first aspect of the present invention, respectively. Referring to FIG. 2A and FIG. 2B, the TFT-type synaptic device 2 according to the present invention includes a semiconductor substrate 200, an insulator 210, a source 220, a drain 222, a semiconductor body 230, and oxide layers 240, a semiconductor layer for channel 250, a TFT gate insulating layer 260, and a TFT gate electrode 270.

The insulator 210 is an isolation insulating layer for isolating devices, is formed on the semiconductor substrate 200, and may generally be composed of an oxide layer such as $SiO_2$. Therefore, the synaptic array structure according to the present invention includes TFT-type synaptic devices positioned on the isolation insulating layer provided on the semiconductor substrate, and the CMOS peripheral circuits placed on other areas of the semiconductor substrate, respectively.

The source 220 and drain 222 are positioned on the isolation insulating layer, are spaced a certain distance apart from each other, and are made of a semiconductor material doped with a high concentration of a first type of impurities. In this specification, the case where the source and the drain are doped with a high concentration of N-type impurities N+ is explained as an example. Therefore, the source and the drain may be made of poly-silicon doped with a high concentration of N-type impurities. In this way, since the doping concentration of the source and drain is high, the resistance of the source and drain is reduced.

The semiconductor body 230 is positioned between the source and the drain, and is made of a semiconductor material doped with a second type of impurities that is opposite to the first type. Therefore, in this embodiment, the semiconductor body is made of poly-silicon doped with P-type impurities.

The oxide layers 240 are positioned between the semiconductor body and the source and between the semiconductor body and the drain, respectively, and may be made of $SiO_2$. Therefore, the source and semiconductor body, and the drain and semiconductor body are electrically isolated by the oxide layers 240, respectively.

The semiconductor layer for channel 250 is positioned on some surfaces of the source and drain, and upper surfaces of the semiconductor body and oxide layers. The semiconductor layer for channel 250 is configured to electrically connect the source and the drain by forming a channel and is made of a semiconductor material.

The TFT gate insulating layer 260 is positioned on the upper surface of the semiconductor layer for channel, and preferably has a stack structure including at least one charge storage layer and an insulating layer. For example, the TFT gate insulating layer may be composed of $Al_2O_3$—$Si_3N_4$—$SiO_2$. $Al_2O_3$ lowers the operating voltage, $Si_3N_4$ functions as a memory to store electrons and efficiently transfers electrons to the semiconductor layer for channel, and $SiO_2$ prevents electrons stored in $Si_3N_4$, the charge storage layer, from escaping.

The TFT gate electrode 270 is positioned on the upper surface of the TFT gate insulating layer and is made of a conductive material to form a gate terminal. For example, the TFT gate electrode may be made of a metal material such as TiN. The TFT gate electrode is preferably provided in self-alignment with the source and the drain.

Meanwhile, it is preferable that the semiconductor body has different heights from the source and drain so that the edges of the oxide layers connecting the semiconductor body and the source and drain have a step. In particular, it is more preferable to configure the upper surface of the semiconductor body to be higher than the upper surfaces of the source and drain. In this way, as the heights of the semiconductor body and the source and drain vary, the semiconductor layer for channel positioned on the upper surfaces of the oxide layers is formed to be bent at the corner area. As a result, the effective length of the semiconductor layer for channel can be extended. Because of this, it is possible to reduce the short channel effect.

Generally, a memory device stores a specific value by adding or subtracting electrons or holes from the charge storage layer of the TFT gate insulating layer. To do this, the memory device is programmed by applying a positive bias voltage to the TFT gate electrode to pull electrons into or push holes out of the TFT gate insulating layer, or is erased by applying a negative bias voltage to the TFT gate electrode to push electrons out or pull holes into of the TFT gate insulating layer.

In this way, applying voltage to the TFT gate electrode is performed by CMOS peripheral circuits positioned near the memory devices. A conventional TFT device implements the positive bias voltages used in the program operation or the negative bias voltages used in the erase operation through the CMOS peripheral circuits. Accordingly, since the conventional TFT device must implement both the negative and positive bias voltages through the CMOS peripheral circuits, there is a problem in that the size of the CMOS peripheral circuit increases and the design becomes complicated.

However, the TFT-type synaptic device according to the present invention can achieve the same effect as applying a negative bias voltage to the TFT gate electrode by connecting an electrode to the semiconductor body and applying a positive bias voltage to the semiconductor body. Because of this, in the synaptic device structure according to the present invention, there is no need for the CMOS peripheral circuits to generate a negative (−) voltage, and only a positive (+) voltage needs to be implemented using the CMOS peripheral circuits. As a result, the structure according to the present invention is configured to apply a positive bias voltage to the TFT gate electrode and the semiconductor body, respectively, making design simpler and easier than the conventional device structures, and also reducing the area required for the CMOS peripheral circuits.

Additionally, in the previous explanation, it was explained that during the erase operation, electrons are pushed out or holes are pulled out from the TFT gate insulating layer. However, since virtually no holes exist in the semiconductor layer for channel, the erase operation is mostly limited to pushing and removing electrons. In this regard, the semiconductor body of the device according to the present invention is made of a semiconductor material doped with P-type impurities, and can provide holes to the semiconductor layer for channel during the erase operation.

As a result, for cells selected among the TFT-type synaptic devices according to the present invention, the erase voltage $V_{ERS}$ required for the erase operation is reduced or the erase operation is possible with only the positive (+) bias voltage. Additionally, the erase operation for unselected cells can be effectively suppressed. Considering that the erase voltage $V_{ERS}$ is greater than the program voltage $V_{PRM}$ in most devices, it is very important that the device according to the present invention can reduce the erase voltage $V_{ERS}$.

On the other hand, in the TFT-type synaptic device according to the present invention, the source and drain are arranged to overlap the TFT gate electrode. A TFT gate insulating layer 260 is disposed between overlapping source and TFT gate electrodes, and between overlapping drain and TFT gate electrodes. In this case, the TFT gate insulating film 260 can be used as a capacitor.

Meanwhile, in the conventional TFT device, when a large voltage is applied to the drain of the TFT device, electron-hole pairs (EHP) are sometimes generated by an electric field. The generated electrons are directly sucked into the drain. However, although the generated holes may disappear naturally over a long period of time, they are unable to go down due to the insulating layer that exists underneath the channel and accumulate underneath the channel.

Due to this situation, if the generated holes continue to accumulate under the channel, a positive voltage is formed, resulting in problems with the electrical characteristics of the device. This is called the Kink effect, and the Kink effect is a common problem with conventional TFT devices. However, in the TFT-type synaptic device according to the present invention, even if a large voltage is applied to the drain and holes are generated, the generated holes leak through the semiconductor body under the channel, thereby preventing the Kink effect.

In the TFT-type synaptic device according to the present invention, since the upper surface of the semiconductor body is higher than the upper surfaces of the source and drain, the semiconductor layer for channel positioned on the upper part of the oxide layer is formed in a curved shape.

In this regard, the conductance of the TFT device must be controlled only by the gate. However, in conventional TFT devices, when the drain voltage increases, the effective length of the channel is reduced, which causes the current to increase. This is called a short-channel effect. It is necessary to reduce the occurrence of the short-channel effect. Here, the effective length is a length that is different from the physical length of the channel and is a length that affects the electrical characteristics of the device.

However, the TFT-type synaptic device according to the present invention having the above-described structure further includes a semiconductor body 230 that is not present in the conventional TFT device. Because of including the semiconductor body 230, the device according to the present invention (1) can reduce the burden on the CMOS peripheral circuits, (2) requires a relatively low erase voltage $V_{ERS}$ by providing holes during the erase operation, and (3) can be resolved the kink effect of conventional TFT devices.

The measure representing the above-mentioned short-channel effect is output resistance $r_o$. The output resistance $r_o$ is defined as the reciprocal of the rate at which current $I_{ds}$ changes when $V_{ds}$ changes, and is expressed in the equation below.

$$r_o = V_{ds}/I_{ds}$$

In an ideal case, $I_{ds}$ should be infinite because it is unrelated to $V_{ds}$, and the better the device, the larger $r_o$ will be. A device having a curved semiconductor layer for channel, such as the device according to the present invention, has a longer effective channel length than a planar device having a flat channel with the same overall length of the device. Therefore, because the $I_{ds}$ change is reduced when $V_{ds}$ changes, the value of the output resistance increases and the short channel effect can be reduced.

Figure 3A:
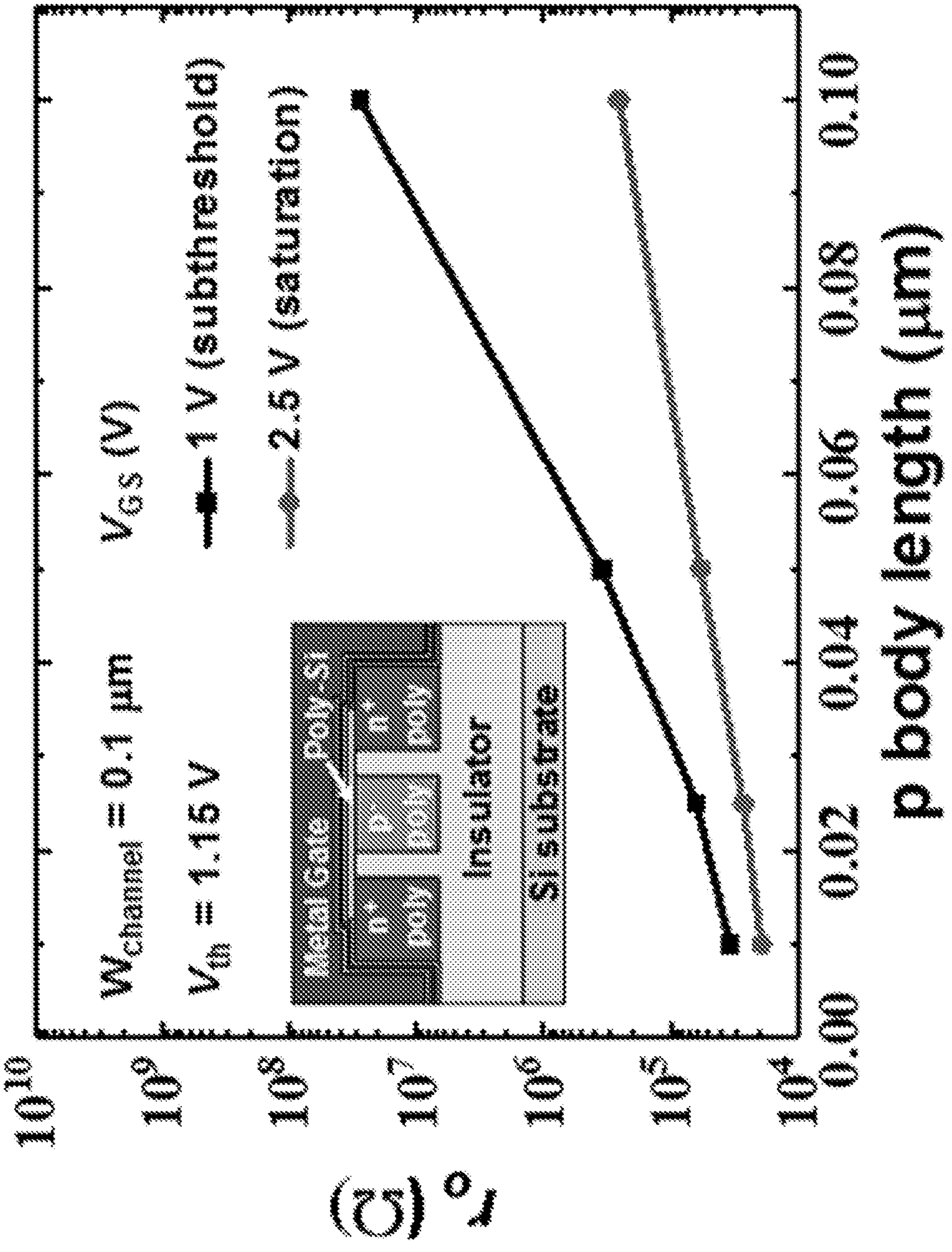
FIG. 3A and FIG. 3B are graphs showing the relationship between the semiconductor body length and $r_o$ for a flat semiconductor layer for channel and a curved semiconductor layer for channel in the synaptic array structure according to a preferred embodiment of the first aspect of the present invention, respectively.
Figure 3B:
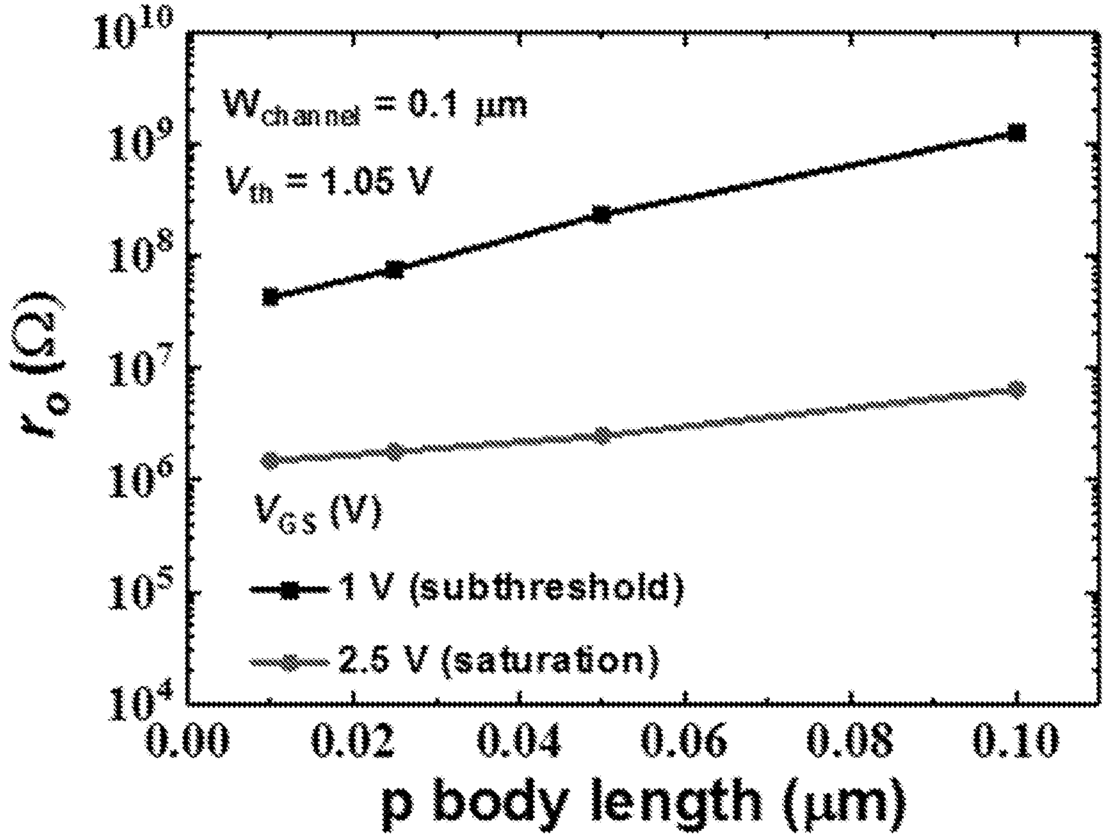

FIG. 3A and FIG. 3B are graphs showing the relationship between the semiconductor body length and $r_o$ for a flat semiconductor layer for channel and a curved semiconductor layer for channel in the synaptic array structure according to a preferred embodiment of the first aspect of the present invention, respectively. FIG. 3A is a graph for a flat channel, and FIG. 3B is a graph for a curved channel. Referring to FIGS. 3A and 3B, it can be seen that the curved semiconductor layer for channel has a larger $r_o$.

Additionally, because the device according to the present invention has the curved channel by the curved semiconductor layer for channel, when a voltage is applied to the TFT gate electrode for the program or erase operation, the electric field is more concentrated in the channel. As a result, when the program or erase operation is performed with the same voltage, more is programmed or erased compared to the conventional structure, which has the effect of increasing the memory window. The memory window refers to the difference between the program threshold voltage and the erase threshold voltage. The larger the memory window, the better the states are distinguished, so the performance of the device is superior.

Figure 4A:
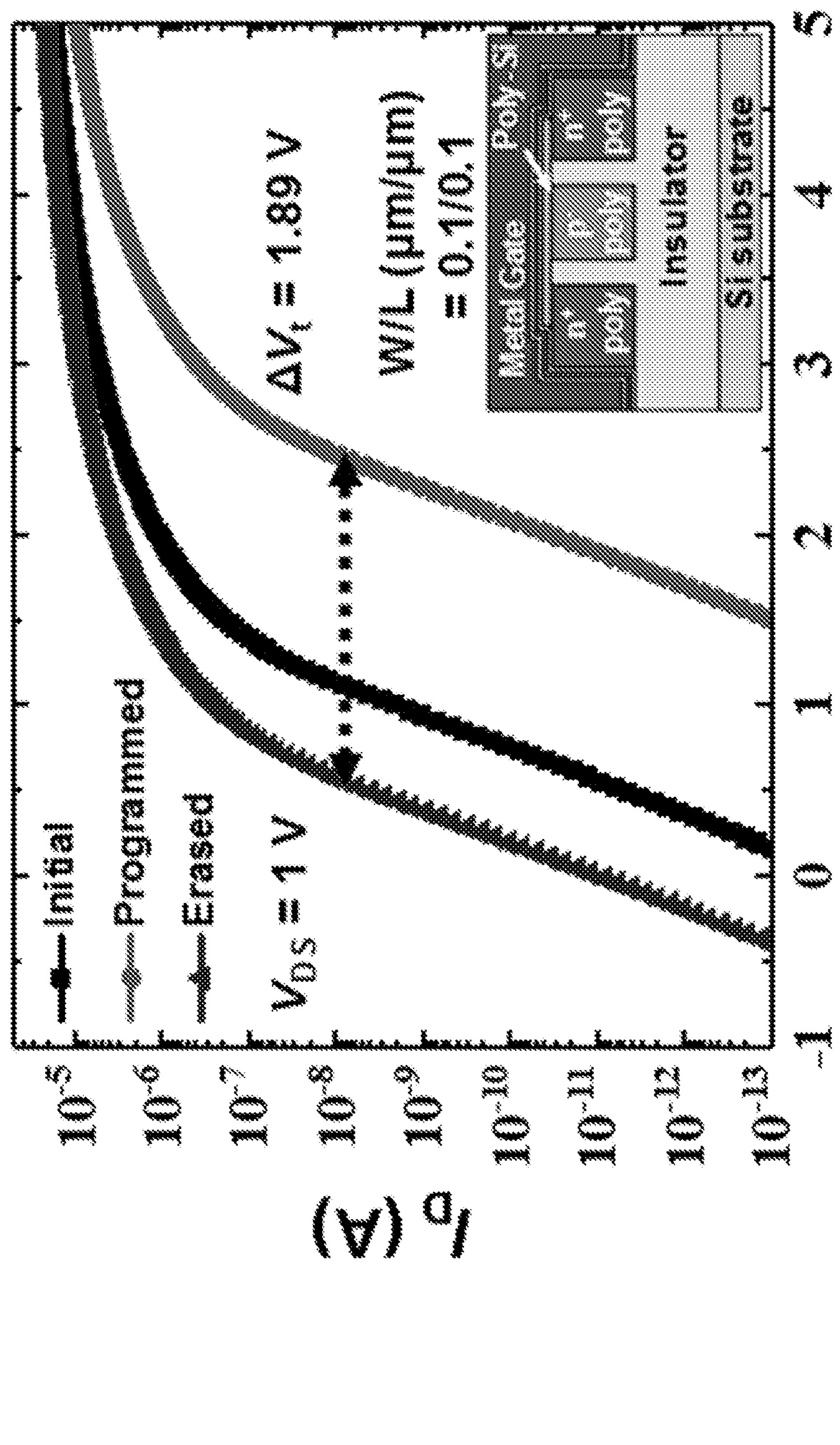
FIG. 4A and FIG. 4B are graphs showing the relationship between $V_{GS}$-$I_D$ for a flat semiconductor layer for channel and a curved semiconductor layer for channel in the synaptic array structure according to a preferred embodiment of the first aspect of the present invention, respectively.
Figure 4B:
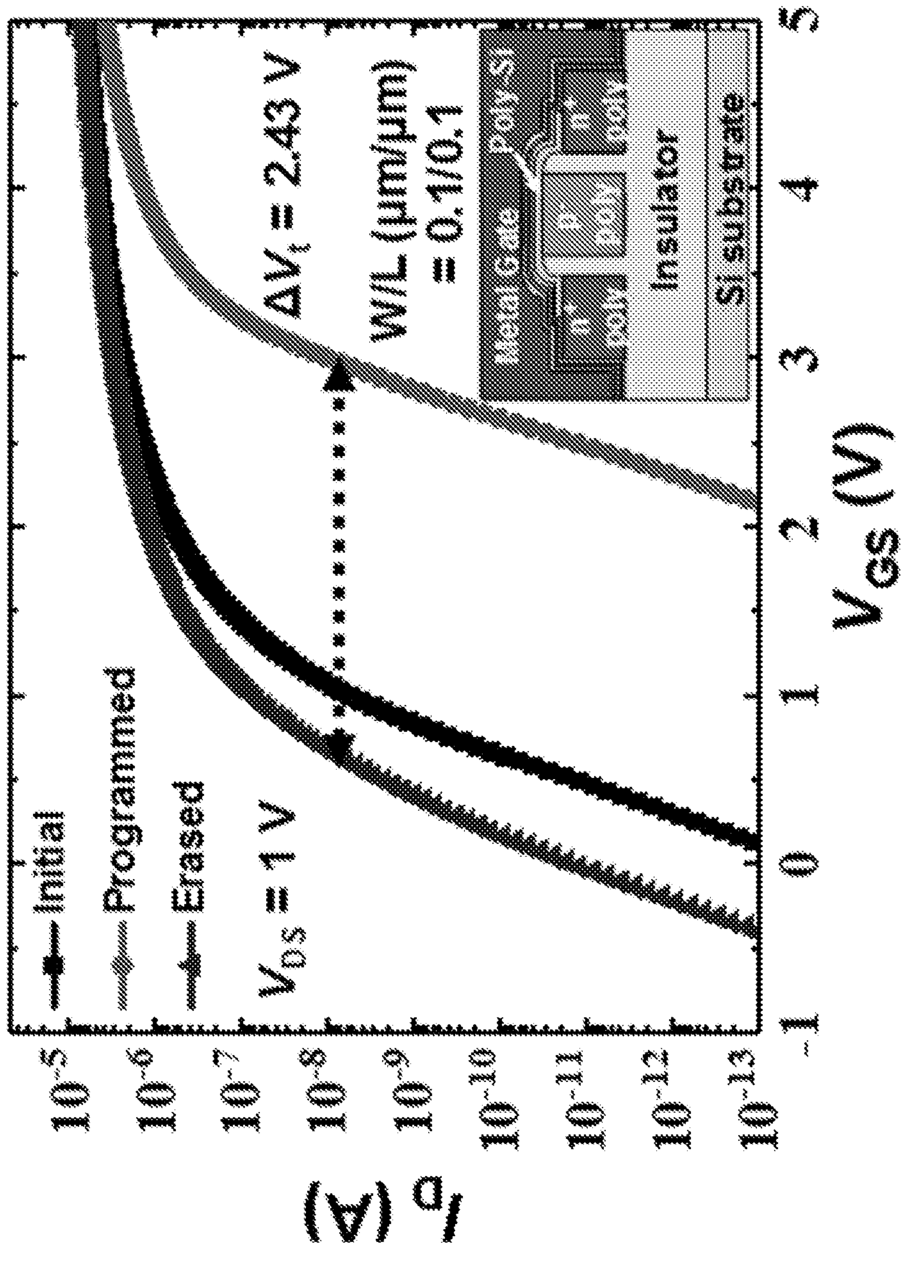

FIG. 4A and FIG. 4B are graphs showing the relationship between $V_{GS}$-$I_D$ for a flat semiconductor layer for channel and a curved semiconductor layer for channel in a synaptic array structure according to the preferred embodiment of the first aspect of the present invention, respectively.

FIG. 4A is a graph for a flat channel, and FIG. 4B is a graph for a curved channel. Referring to FIG. 4A and FIG. 4B, it can be seen that in the case of the curved semiconductor layer for channel, the arrow in the horizontal direction is wider. This confirms that the memory window of the curved semiconductor layer for channel is larger than that of the flat semiconductor layer for channel.

Additionally, for low-power operation of the system, the operating current of the synaptic device must be low. In this regard, it can be seen that the device having the curved semiconductor layer for channel in FIG. 4B has a lower operating current than the device with the flat semiconductor layer for channel in FIG. 4A. This is because a device with the curved semiconductor layer for channel has a large effective channel length.

In summary, the TFT-type synaptic device according to the present invention has the curved semiconductor layer for channel, so that (1) the output resistance can be increased by reducing the short-channel effect, (2) the efficiency of the program and erase operations improves, making it possible to increase the memory window or reduce the program and erase voltages, and (3) the current is lowered, making it possible to operate with low power.

Figure 5A:
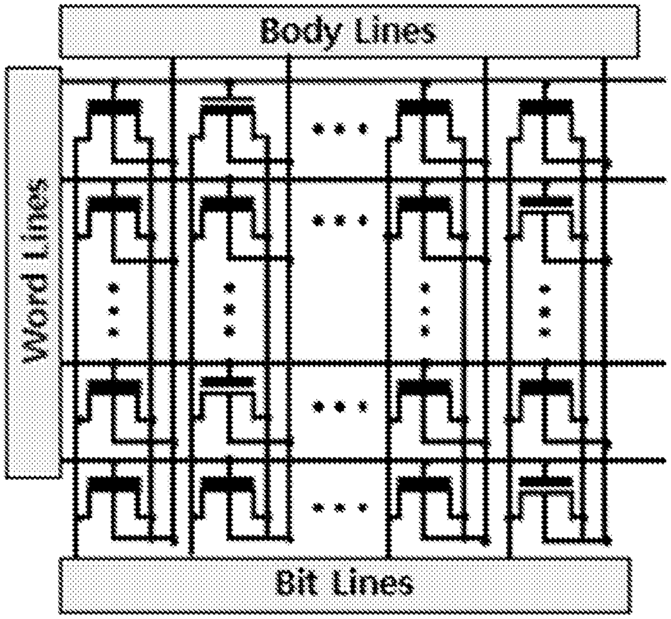
FIG. 5A and FIG. 5B are equivalent circuit diagrams for an AND type synaptic array architecture and for a NOR type synaptic array architecture according to a preferred embodiment of the first aspect of the present invention, respectively.
Figure 5B:
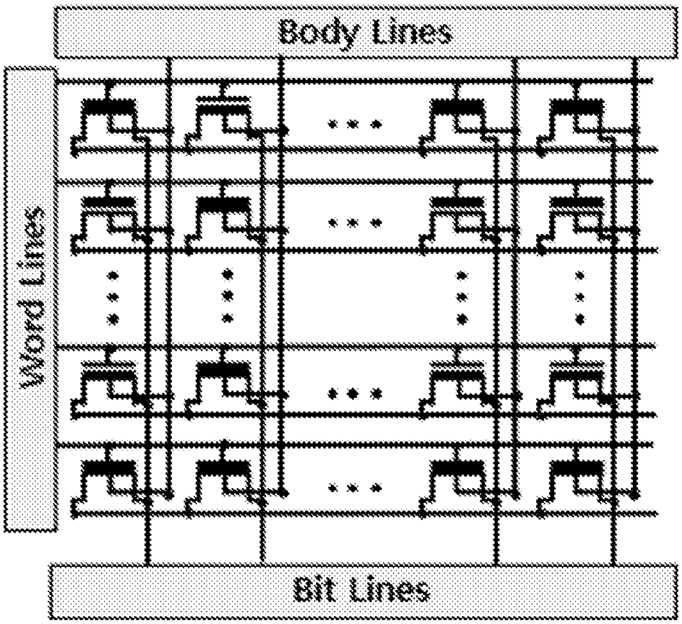

FIG. 5A and FIG. 5B are equivalent circuit diagrams for an AND type synaptic array architecture and for a NOR type synaptic array architecture according to a preferred embodiment of the first aspect of the present invention, respectively. As shown in FIG. 5A, the synaptic array structure can be configured as an AND-type synaptic array architecture by arranging the source and drain lines for TFT-type synaptic devices in parallel. In addition, as shown in FIG. 5B, the synaptic array structure can be configured as a NOR-type synaptic array architecture by arranging the source and drain lines of the TFT-type synaptic devices perpendicularly.

The AND type array architecture has the advantages which the reading speed is faster than that of the NAND type array architecture and the number of devices per area is larger than that of the NOR type array architecture. From the perspective of researching neuromorphic systems, the NAND type array architecture has the advantage of being a mature technology that is widely used in the industry, but has the disadvantage of having a low degree of freedom to use it structurally and a slow reading speed of device values.

Meanwhile, the NOR type array architecture has the widest degree of structural freedom and is widely used when implementing neuromorphic systems. However, the NOR type array architecture has the disadvantage of having a small number of devices per area. The NOR type array architecture uses the HCI (Hot—Carrier Injection) mechanism when performing the program operation. Because the HCI mechanism allows current to flow in the channel, the NOR type array architecture has the disadvantage of increasing power consumption and limiting the number of devices that can be programmed at once.

The AND architecture is a compromise between the NOR architecture and the NAND architecture and has less freedom of implementation than the NOR architecture, but has more functions that can be implemented than the NAND architecture. In addition, the AND architecture, unlike the NOR architecture, uses the FN-Tunneling mechanism for both program and erase operations, allowing a large number of devices to be programmed or erased at once with a small amount of power. In the FN (Fowler-Nordheim) tunneling mechanism, no current flows in the channel. In addition, the AND architecture cannot achieve as high an integration degree in the number of devices per area as the NAND architecture, but it can definitely achieve higher integration degree than that of the NOR architecture.

In summary, the AND type synaptic array architecture has the following advantages. (1) Since both program and erase operations use the FN-Tunneling method, a larger number of cells can be programmed at once and consume less energy than the NOR architecture that uses HCI mechanism when programming. (2) The read out time is faster than that of the NAND architecture. Here, the read out time refers to the time required to read the value stored in the device. (3) Higher integration degree is possible than the NOR architecture. (4) Higher degree of freedom in neuromorphic system implementation is possible than the NAND architecture.

By connecting the TFT-type synaptic devices of the above-described structure in series to form cell strings and connecting electrically the word lines to the gate electrodes of the TFT-type synaptic devices, a NAND-type synaptic array architecture can be constructed. In this case, it is preferable that the NAND type synaptic array architecture further includes at least one switch device at each end of the cell strings.

Hereinafter, with reference to the accompanying drawings, a method of fabricating the synaptic array structure including TFT-type synaptic devices arranged in an array and CMOS peripheral circuits will be described in detail. The synaptic array structure according to the present invention is characterized by being fabricated through several additional processes to the conventional CMOS process.

Figure 6:
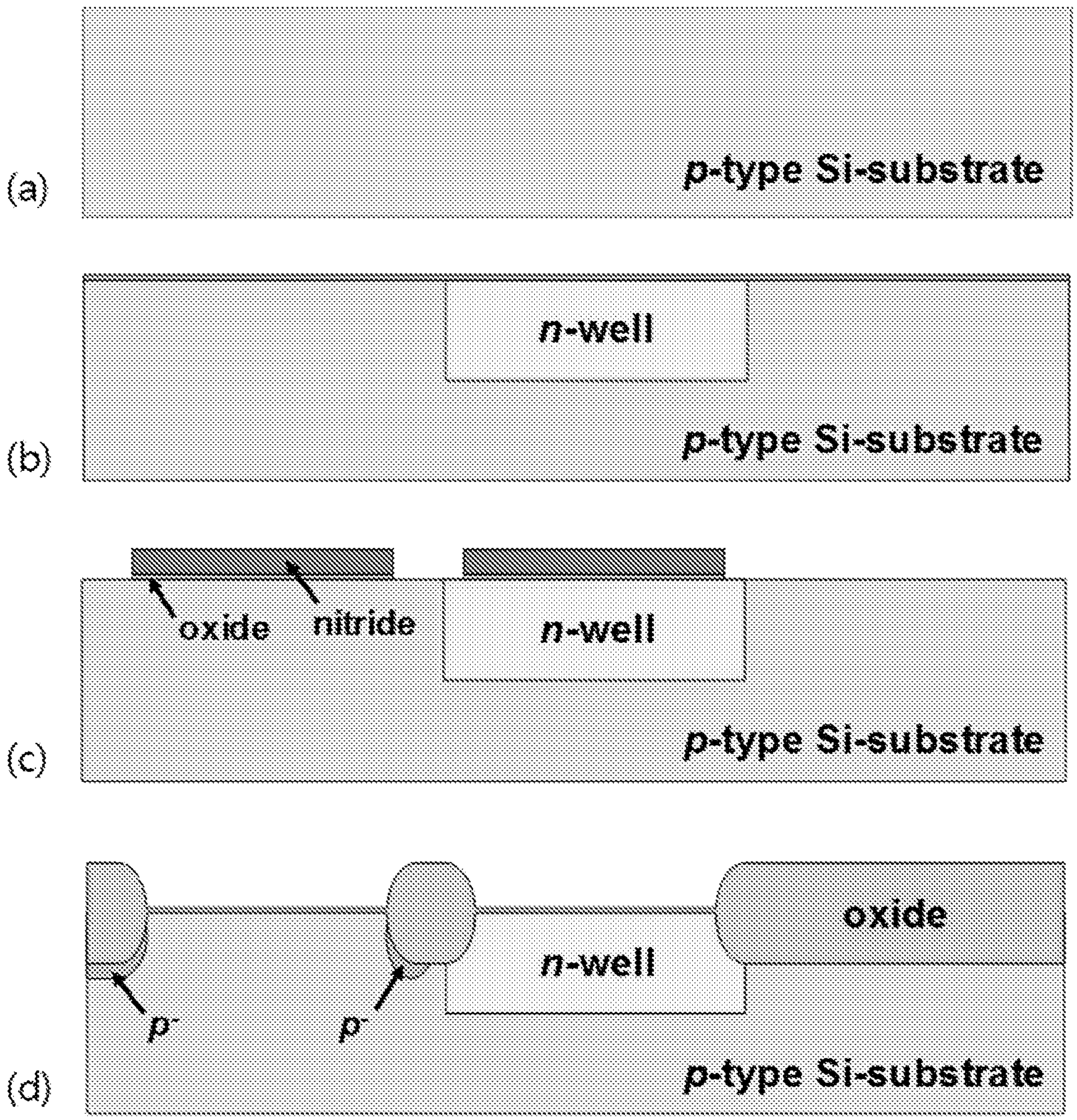
FIG. 6 shows cross-sectional diagrams representing the process of fabricating the synaptic device region and the NMOSFET and PMOSFET devices region of the CMOS peripheral circuit on the semiconductor substrate in the method of fabricating the synaptic array structure according to an embodiment of the second aspect of the present invention.

FIG. 6 shows cross-sectional diagrams representing the processes of fabricating the synaptic device region and the NMOSFET and PMOSFET device region of the CMOS peripheral circuit on the semiconductor substrate in the method of fabricating the synaptic array structure according to the embodiment of the second aspect of the present invention.

Referring to FIG. 6, a P-type semiconductor substrate is prepared ((a) in FIG. 6). Next, an oxide layer is formed on the substrate and then masked using a mask to generate an N-well doped with N-type impurities ((b) in FIG. 6). Since the fabricating process according to the present invention is to make the TFT-type synaptic devices and the NMOSFET and PMOSFET devices in the CMOS peripheral circuit together, the N-well is needed to form devices of the CMOS peripheral circuit.

Next, a nitride layer is formed on the surface of the resulting product, and the part where devices are not required (i.e., the part where the isolation wall is to be formed) is etched using a photolithography process using a mask ((c) in FIG. 6). Next, after performing a photolithography process using a mask, a P-type implant process is performed to electrically separate NMOSFET devices connected to the P-type substrate from each other.

Next, an oxide layer is grown at a high temperature to form an insulating layer only in areas where there is no nitride layer, and then the nitride layer is removed in order to form an isolation insulating layer for device isolation ((d) in FIG. 6). Next, an implant process is performed to adjust the threshold voltage of the NMOSFET and PMOSFET devices of the CMOS peripheral circuit. Through the above-described process, the isolation insulating layer is formed on the semiconductor substrate to electrically isolate devices to be fabricated in the later processes.

Figure 7:
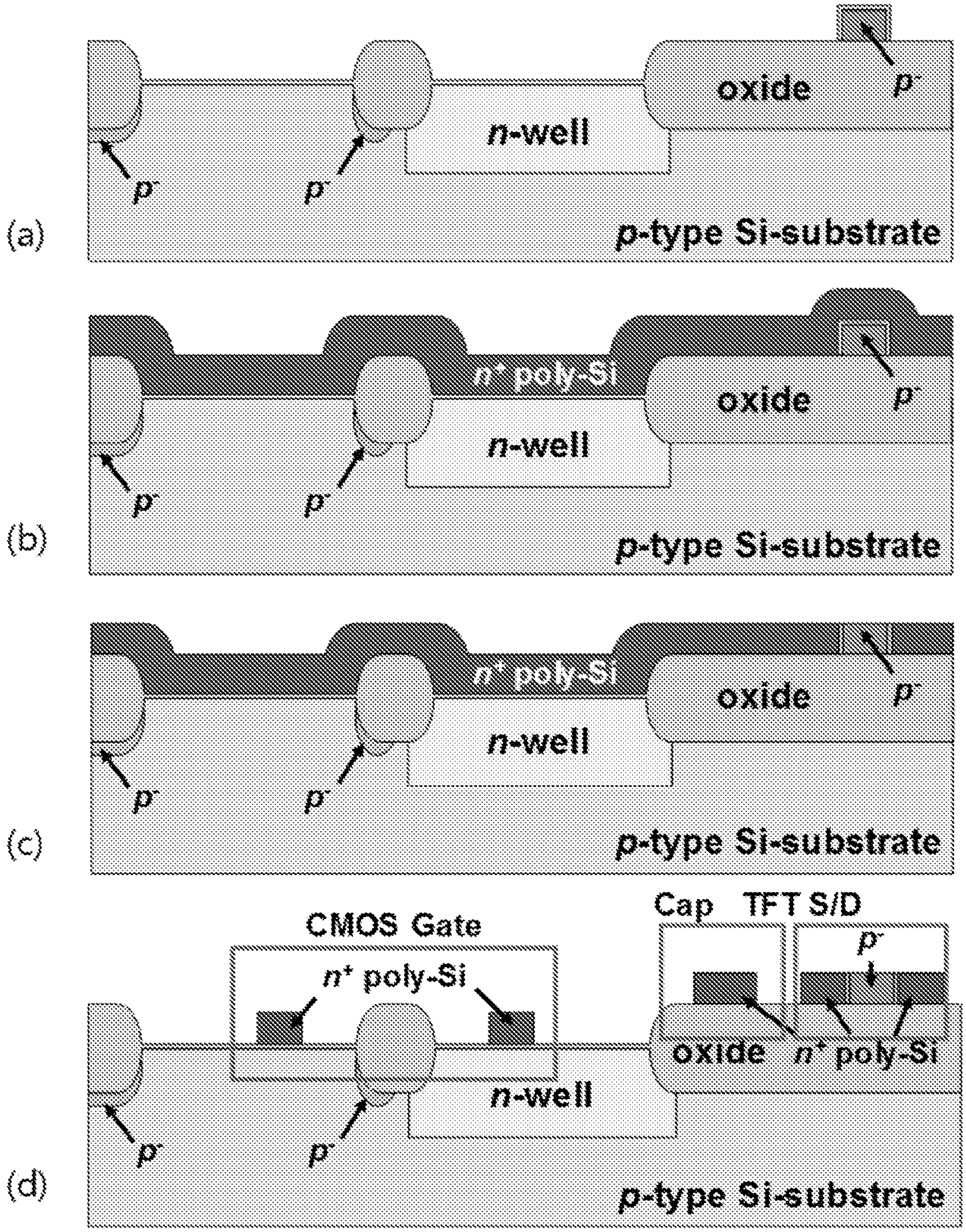
FIG. 7 shows cross-sectional diagrams representing the process of fabricating the semiconductor body, source and drain of the synaptic device, and the gate electrode of the NMOSFET and PMOSFET devices of the CMOS peripheral circuit in the method of fabricating the synaptic array structure according to the embodiment of the second aspect of the present invention.

FIG. 7 shows cross-sectional diagrams representing the process of fabricating the semiconductor body, source and drain of the synaptic device, and the gate electrode of the NMOSFET and PMOSFET devices of the CMOS peripheral circuit in the method of fabricating the synaptic array structure according to the embodiment of the second aspect of the present invention. Referring to FIG. 7, P-type doped silicon is grown on the isolation insulating layer for isolating the NMOSFET and PMOSFET devices of the CMOS peripheral circuit, is etched using a mask to form a semiconductor body and then formed an oxide layer on the surface of the formed semiconductor body ((a) in FIG. 7).

When fabricating a TFT device according to the conventional process, an insulator (that is, oxide layer) is grown separately on a Si substrate and the TFT device is fabricated on the surface of the grown insulator. However, in the present invention, the NMOSFET and PMOSFET devices of the CMOS peripheral circuit and the synaptic device are fabricated together by sharing fabrication processes, and the synaptic device is fabricated on the isolation insulating layer. Therefore, the fabricating method according to the present invention can eliminate one process of growing an oxide layer.

Next, N-type doped poly silicon is deposited on the resulting product ((b) in FIG. 7). The N-type poly silicon becomes the drain and source lines of the TFT-type synaptic device, and also the gate electrodes of the NMOSFET and PMOSFET devices of the CMOS peripheral circuit. It can also be used to make capacitor devices needed in circuits.

Next, through surface planarization process, the N+ poly Si portion of the upper surface of the semiconductor body is removed, and then the drain and the source are separated ((c) in FIG. 7). In general, it is good to generate a doped semiconductor body (i.e., P body) in a TFT device. However, this is not possible because the number of masks required to generate the P body increases.

However, the fabricating method according to the present invention produces the source, semiconductor body and drain of the synaptic device are formed in a separated state without using additional masks through planarization process by a chemical-mechanical polishing (CMP) process performed without a mask after the processes (a) and (b) of FIG. 7.

Next, using a mask, the N+ poly silicon is carved out to form the gate electrodes of the NMOSFET and PMOSFET devices of the peripheral circuit (left square), the lower electrode of the capacitor (middle square) and the source and drain (right square) of the TFT synaptic device among the various components of the circuit simultaneously ((d) in FIG. 7). In this process, the number of masks can be reduced by one.

Next, although not shown in the drawing, with the gate electrodes of the NMOSFET and PMOSFET devices of the CMOS peripheral circuit, and the source and drain of the TFT-type synaptic device formed, the silicon is slightly etched without using a mask. As a result, the P—Si semiconductor body covered with oxide remains the same, and only the exposed N—Si source and drain are slightly lowered. Therefore, in the final device structure, a structure in which the semiconductor layer for channel is curved can be implemented.

Figure 8:
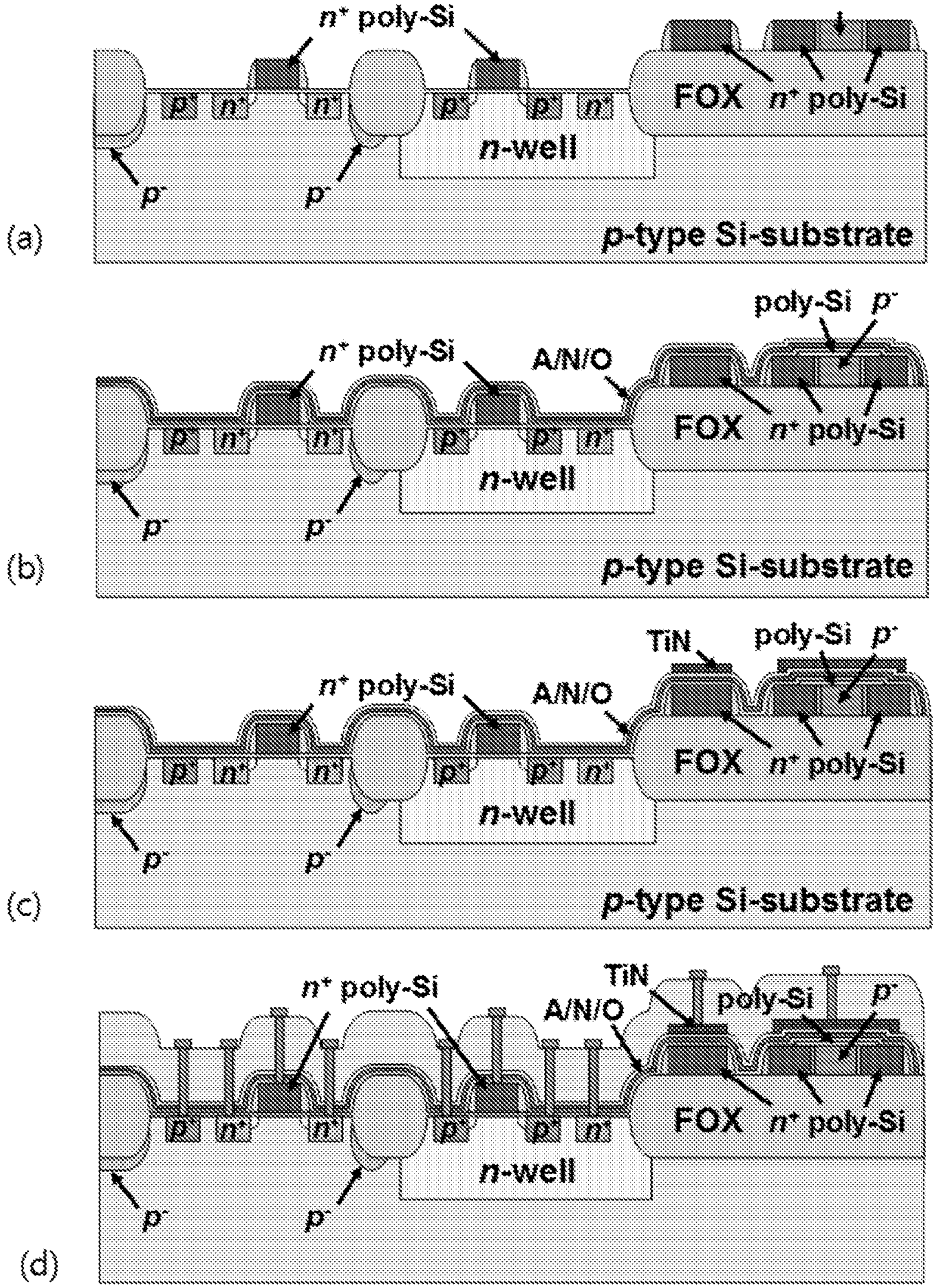
FIG. 8 shows cross-sectional diagrams representing the process of fabricating the TFT gate insulating layer and TFT gate electrode of the synaptic device and the source, drain and wires of the NMOSFET device and PMOSFET devices of the CMOS peripheral circuit in the method of fabricating the synaptic array structure according to the embodiment of the second aspect of the present invention.

FIG. 8 shows cross-sectional diagrams representing the process of fabricating the TFT gate insulating layer and TFT gate electrode of the synaptic device and the sources, drains and wires of the NMOSFET and PMOSFET devices of the CMOS peripheral circuit in the method of fabricating the synaptic array structure according to the embodiment of the second aspect of the present invention.

Referring to FIG. 8, N-type doping and P-type doping are sequentially performed using two masks to form the sources and drains of the NMOSFET and PMOSFET devices of the CMOS peripheral circuit. At this time, to form the LDD (Lightly Doped Drain), two photolithography processes and two implant processes are performed using the same mask, and an oxidation process is inserted in the middle of the processes ((a) in FIG. 8).

Next, poly-Si, which will be the semiconductor layer for channel of the TFT-type synaptic device, is deposited and patterned using a mask to form a semiconductor layer for channel. Then, a TFT gate insulating layer stack to implement the memory function is formed. ((b) in FIG. 8).

Next, TiN, a metal material for forming the TFT gate electrode and upper electrode of the capacitor of the TFT-type synaptic device, is deposited and etched using a mask. At this time, since this process is necessary when making a capacitor in the conventional CMOS process, one of the TFT gate electrode formation process and the CMOS process is shared ((c) in FIG. 8).

Next, an oxide layer for passivation is deposited on the surface of the resulting product, and then metal wiring is formed at the metal and N+ gate ((d) in FIG. 8).

Through the above-described process, the synaptic array structure according to the present invention can process the TFT-type synaptic devices and the NMOSFET and PMOSFET devices of the CMOS peripheral circuits together. When fabricating a neuromorphic system, not only TFT-type synaptic devices for synaptic operation but also CMOS peripheral circuits for reading and writing the devices are essential.

Therefore, the fabricating processes for the synaptic devices and the fabricating processes for the CMOS peripheral circuits must be carried out simultaneously. By performing the processes at once, as in the present invention, each process can naturally affect each other, and the number of masks and manufacturing processes can be minimized.

First, in the above-described process (a) of FIG. 7, TFT-type synaptic device is manufactured on a field oxide, which is an insulating layer for isolating the NMOSFET and the PMOSFET devices of the CMOS peripheral circuits. As a result, there is no need to grow additional oxides to manufacture TFT-type synaptic devices, thereby reducing the number of processes.

Additionally, by using the semiconductor body line formed in this process, it is possible to make resistor devices necessary for circuit implementation. In the subsequent oxidation process, the gate insulating layer of the NMOSFET and PMOSFET devices of the CMOS peripheral circuit and the insulating layer (240 in the FIG. 2B) to insulate the source, drain, and body of the TFT-type synaptic devices are formed together.

In addition, in the above-described process (b) of FIG. 7, N+ poly silicon is grown and used as the source and drain of the TFT-type synaptic device and the gate electrodes of the NMOSFET and PMOSFET devices of the CMOS peripheral circuit. As a result, the number of fabrication processes can be reduced compared to when the devices are processed separately.

In addition, using CMP (Chemical-Mechanical Polishing) process, the semiconductor body, source and drain of the TFT-type synaptic device can be separated to each other without using an additional mask, and the number of processes can be reduced.

In addition, by simultaneously etching to form the gate electrodes of the NMOSFET and PMOSFET devices of the CMOS peripheral circuit and the source and drain of the TFT synaptic device, the number of masks and the number of processes can be reduced. Additionally, the capacitors needed for the circuit can also be fabricated using the same mask.

In addition, when fabricating contact holes and electrodes, the NMOSFET and PMOSFET devices of the CMOS peripheral circuit and TFT-type synaptic devices are processed simultaneously, making it possible to reduce the number of masks and processes.

Through the above-described processes, the synaptic array structure according to the present invention can minimize the number of masks and fabricating process steps by simultaneously processing the TFT-type synaptic devices and the NMOSFET and PMOSFET devices of the CMOS peripheral circuit.

The upper surfaces of the gate electrodes of the NMOSFET and PMOSFET device of the CMOS peripheral circuit are preferably formed to be higher than the upper surfaces of the source and drain of the TFT-type synaptic device.

In the above, the present invention has been described with respect to the preferred embodiment thereof, but this is only an example and does not limit the present invention. It will be appreciated that various modifications and applications not exemplified above are possible within the scope of the present invention defined in the appended claims. In addition, the differences related to such modifications and applications should be construed as being included in the scope of the present invention defined in the appended claims.

What is claimed is:

1. A synaptic array structure includes:

a semiconductor substrate;

an isolation insulating layer positioned in a predetermined area on the semiconductor substrate to isolate devices;

CMOS peripheral circuits including PMOSFET and NMOSFET devices provided on the semiconductor substrate; and a plurality of TFT-type synaptic devices arranged in an array on the isolation insulating layer;

wherein, the TFT-type synaptic device includes:

a source and drain positioned on the isolation insulating layer and spaced apart from each other by a predetermined distance, and made of a semiconductor material doped with a first type of impurities;

a semiconductor body positioned between the source and the drain and made of a semiconductor material doped with a second type of impurities opposite to the first type;

oxide layers positioned between the semiconductor body and the source and between the semiconductor body and the drain;

a semiconductor layer for channel positioned on upper surfaces of the semiconductor body and the oxide layers, configured to electrically connect the source and the drain by forming a channel, and made of a semiconductor material;

a TFT gate insulating layer positioned on an upper surface of the semiconductor layer for channel and comprising of at least one insulating layer; and a TFT gate electrode positioned on an upper surface of the TFT gate insulating layer and made of a conductive material.

2. The synaptic array structure according to claim 1, wherein the thickness of the gate electrodes of the PMOSFET and NMOSFET devices of the CMOS peripheral circuit is thicker than the thickness of the source and drain of the TFT-type synaptic device.

3. The synaptic array structure according to claim 1, wherein the TFT gate electrode of the TFT-type synaptic device is provided in a self-aligned form with the source and drain of the TFT-type synaptic device.

4. The synaptic array structure according to claim 1, wherein the synaptic array structure implements an AND-type synaptic array architecture by arranging the source and drain lines for TFT-type synaptic devices in parallel, or a NOR-type synaptic array architecture by arranging orthogonally the source and drain lines of the TFT-type synaptic devices.

5. The synaptic array structure according to claim 1, wherein the synaptic array structure implements a NAND-type synaptic array architecture by connecting TFT-type synaptic devices in series to form cell strings and by connecting word lines to the TFT gate electrodes of TET-type synaptic devices, and wherein the synaptic array structure further includes at least one switch device at each end of the cell strings.

6. The synaptic array structure according to claim 1, wherein the TFT gate insulating layer has a stack structure including at least a charge storage layer and an insulating layer.

7. The synaptic array structure according to claim 1, wherein the semiconductor body is configured to have different heights from the source and drain to have steps in edges of the oxide layers connecting between the semiconductor body and the source and between the semiconductor body and the drain, and the semiconductor layer for channel on surface of the oxide layer is curved by the steps formed in the edges of the oxide layers, so that a short channel effect is suppressed by changing the effective length of the semiconductor layer for channel due to forming a curved channel.

8. The synaptic array structure according to claim 7, wherein the upper surface of the semiconductor body is formed higher than the upper surfaces of the source and drain.

9. The synaptic array structure according to claim 1, wherein the semiconductor body is made of a semiconductor material doped with P-type impurities and is configured to provide holes to the semiconductor layer for channel during an erase operation, thereby reducing a erase voltage $V_{ERS}$ required during the erase operation for selected cells or being capable of performing the erase operation with only positive (+) bias voltage, and suppressing the erase operation for unselected cells.

10. The synaptic array structure according to claim 1, wherein the source or drain of the TFT-type synaptic device and the TFT gate electrode of the TFT-type synaptic device are provided to overlap each other, and the TFT gate insulating layer provided between the overlapping source and the TFT gate electrode or between the overlapping drain and the TFT gate electrode is used as a capacitor.

* * * * *